United States Patent
Wallace et al.

(10) Patent No.: US 9,778,975 B2
(45) Date of Patent: Oct. 3, 2017

(54) HIDDEN DATA IDENTIFICATION IN SOLID STATE DRIVE FORENSICS

(71) Applicant: S34A, INC., Reston, VA (US)

(72) Inventors: Henry B. Wallace, Fincastle, VA (US); David Sun, Fincastle, VA (US)

(73) Assignee: S34A, Inc., Reston, VA (US)

( * ) Notice: Subject to any disclaimer, the term of this patent is extended or adjusted under 35 U.S.C. 154(b) by 49 days.

(21) Appl. No.: 14/716,872

(22) Filed: May 19, 2015

(65) Prior Publication Data

US 2015/0331743 A1     Nov. 19, 2015

Related U.S. Application Data

(60) Provisional application No. 62/000,478, filed on May 19, 2014.

(51) Int. Cl.
  *G06F 11/10* (2006.01)
  *G11C 29/52* (2006.01)

(52) U.S. Cl.
  CPC ...... *G06F 11/1004* (2013.01); *G06F 11/1068* (2013.01); *G11C 29/52* (2013.01)

(58) Field of Classification Search
  CPC .. G06F 11/1012; G06F 11/10; G06F 11/1004; G06F 11/108; G06F 11/1016; H03M 13/091
  See application file for complete search history.

(56) References Cited

U.S. PATENT DOCUMENTS

| | | | |
|---|---|---|---|
| 2011/0041005 A1* | 2/2011 | Selinger | G06F 11/10 714/719 |
| 2012/0257436 A1 | 10/2012 | Lee | |
| 2014/0006903 A1* | 1/2014 | Bybell | G06F 11/1012 714/773 |
| 2014/0310445 A1* | 10/2014 | Fitzpatrick | G11C 16/20 711/103 |
| 2014/0317479 A1* | 10/2014 | Candelaria | G06F 11/1004 714/807 |
| 2015/0227312 A1 | 8/2015 | Feehrer et al. | |

* cited by examiner

*Primary Examiner* — Shelly A Chase
(74) *Attorney, Agent, or Firm* — Terry M. Sanks, Esquire; Beusse Wolter Sanks & Maire, PLLC

(57) ABSTRACT

A method of isolating hidden data in a solid state memory system is disclosed including obtaining a logical block address (LBA) image from the memory system, obtaining a physical block address (PBA) image, determining whether an error exists in the PBA image and correcting the error, calculating an ETCRC on each sector of the LBA image and building a search tree indexed on the ETCRC value. For each sector in the PBA image, the method also includes computing an error tolerant cyclic redundancy check (ET-CRC) value and searching for the ETCRC value in the LBA search tree. If the ETCRC value is found, also included is comparing the cyclic redundancy check (CRC) of the LBA and PBA sectors, and outputting to an output file the PBA sector as hidden data if either the ETCRC value is not found in the LBA search tree or the CRC comparison fails.

18 Claims, 15 Drawing Sheets

|     | 180 |   |   |   |   |   |   |   |
|-----|-----|---|---|---|---|---|---|---|
| PBA | 0 | B | C | X | E | F | G | H |
| LBA | 0 | B | C | D | E | F | G | H |

| PBA | A | 0 | C | X | E | F | G | H |
|-----|---|---|---|---|---|---|---|---|
| LBA | A | 0 | C | D | E | F | G | H |

| PBA | A | B | 0 | X | E | F | G | H |
|-----|---|---|---|---|---|---|---|---|
| LBA | A | B | 0 | D | E | F | G | H |

| PBA | A | B | C | 0 | E | F | G | H |
|-----|---|---|---|---|---|---|---|---|
| LBA | A | B | C | 0 | E | F | G | H |

|    |         |     400 |    |         |    401 |
|----|---------|---------|----|---------|--------|

| # | bits | # | bits |
|---|------|---|------|
| 1 | 1 1 1 1 1 1 1 | 20 | 1 1 0 1 1 0 1 |
| 2 | 1 1 1 1 1 1 0 | 21 | 1 0 1 1 1 0 1 |
| 3 | 1 1 1 1 1 0 1 | 22 | 0 1 1 1 1 0 1 |
| 4 | 1 1 1 1 0 1 1 | 23 | 1 1 1 0 0 1 1 |
| 5 | 1 1 1 0 1 1 1 | 24 | 1 1 0 1 0 1 1 |
| 6 | 1 1 0 1 1 1 1 | 25 | 1 0 1 1 0 1 1 |
| 7 | 1 0 1 1 1 1 1 | 26 | 0 1 1 1 0 1 1 |
| 8 | 1 0 1 1 1 1 1 | 27 | 0 1 1 1 0 1 1 |
| 9 | 0 1 1 1 1 1 1 | 28 | 1 1 0 0 1 1 1 |
| 10 | 1 1 1 1 1 0 0 | 29 | 1 1 0 1 0 1 1 |
| 11 | 1 1 1 1 0 1 0 | 30 | 1 0 1 1 0 1 1 |
| 12 | 1 1 1 0 1 1 0 | 31 | 0 1 1 0 1 1 1 |
| 13 | 1 1 0 1 1 1 0 | 32 | 1 1 0 0 1 1 1 |
| 14 | 1 1 0 1 1 1 0 | 33 | 1 0 1 0 1 1 1 |
| 15 | 1 0 1 1 1 1 0 | 34 | 0 1 1 0 1 1 1 |
| 16 | 0 1 1 1 1 1 0 | 35 | 1 0 0 1 1 1 1 |
| 17 | 1 1 1 1 0 0 1 | 36 | 0 1 0 1 1 1 1 |
| 18 | 1 1 1 0 1 0 1 | 37 | 0 0 1 1 1 1 1 |
| 19 | 1 1 1 0 1 1 0 1 |    |        |

HIDDEN DATA IDENTIFICATION IN SOLID STATE DRIVE FORENSICS

CROSS-REFERENCE TO RELATED APPLICATIONS

This application claims the benefit of U.S. Provisional Application No. 62/000,478 filed May 19, 2014, and incorporated herein by reference in its entirety.

FIELD OF DISCLOSURE

The present disclosure generally relates to forensic data recovery and more particularly to accessing hidden data files.

BACKGROUND

The statements in this section merely provide background information related to the present disclosure and may not constitute prior art.

Existing methods to recover hidden data files from computational storage devices are tedious and time-consuming. Solid state drives (SSDs or SSD when discussing a singular solid state drive) are complex computational storage devices that use NAND flash memory chips. Such memory devices have a high data storage capacity; however, they are difficult to manage because existing data in a chip cannot simply be overwritten, but rather must first be erased, and then written on again. Furthermore, data must be erased in large blocks; specifically, on the order of a million bytes, but may also be written in smaller blocks, on an order of thousands of bytes. These hindrances pose a problem for forensic analysts and others seeking to recover hidden data because they impose significant time constraints on the process and thus potentially prevent successful hidden data recovery from ever being accomplished.

In an effort to make the above memory chips easier to use and data more accessible, a flash translation layer (FTL) of software is included in the SSD to handle the details of deleting old data and writing new data, thus taking the burden of this task away from the host operating system. A memory array of the SSD has two spaces: a logical block address (LBA) space and a physical block address (PBA) space. These spaces are overlaid spaces. The LBA space is the data structure that the host computer sees and comprises the sectors in which data is stored. The PBA space is the memory provided by flash chips, and is generally up to 20% larger than the LBA space, depending on the particular configuration. The LBA space is mapped into the PBA space by the FTL software.

A legacy hard disk drive (HDD), a similar device, has a simpler configuration in that its LBA and PBA spaces essentially have a corresponding size ratio of one-to-one, with the PBA being only a fraction of a percent larger than the LBA.

The extra PBA space in the SSD is referred to as over provisioning space and has several purposes. These purposes include storing SSD firmware (which is the firmware that runs the SSD's internal microcontroller and which is typically 100K to 200K bytes, though this range is not provided to be limiting), NAND flash wear leveling, bad block management, housing FTL management tables, and garbage collection.

Wear leveling is a type of software algorithm that distributes the reading and writing activities evenly among the flash chips on the SSD. This is needed because NAND flash exhibits rapid wear out mechanisms, resulting in degradation of the data written to the SSD. FTL management tables comprise memory storage for the LBA/PBA mapping table, which can be gigabytes in size. They also include other general task, or housekeeping, information. Garbage collection is a software algorithm which collects and erases currently unused but previously written areas in flash memory in order to prepare clean sections for future writes and avoid delays in erasing. All of the above functions are well known.

A problem occurs as a side effect in the operation of the SSD, which is that forensically valuable data gets moved out of the LBA space to where it cannot be accessed via the host computer interface. The management complexity and non-one-to-one LBA and PBA memory spaces of the SSD (as contrasted from the legacy HDD) further impede successful data recovery and force individuals who want to recover the data, such as forensic analysts, to attempt to reverse engineer the algorithms in the SSD to obtain the hidden data, which can be very time consuming.

Referring now to FIG. 1, a block diagram showing an exemplary relationship between the PBA space and the LBA space in the memory array of an SSD space is shown. Importantly, the PBA space 100 is usually larger than the LBA space 101 (typically by seven percent (7%), but in some instances up to twenty percent (20%)) within the memory array 10 of the SSD. For example, an SSD with a 128 GB storage capacity would have about 119 GB of LBA space available for file storage. The remaining 9 GB would be used as over provisioning space and may be a resource for wear leveling, garbage collection, and other SSD firmware functions. The LBA space 101 is a logical representation, and does not reveal where in the memory devices data is stored. The PBA space 100 consists of memory in the form of physical flash memory chips. As shown, the LBA space 101 is a subset of the PBA space 100.

The data that is stored on SSDs and HDDs is in aggregations known as sectors. A sector is typically 512 bytes in length, but may be larger. The NAND flash chips can accommodate this form of data storage, considered sectors, and so, in most cases, integral numbers of LBA sectors are stored in physical flash memory pages.

There are currently two main methods to read the over provisioning space as a first step to recover hidden data. The first method consists of using custom read commands over the host interface port of the SSD. However, these commands are not standardized and are proprietary, and do not even exist for most SSD models, or are password protected or encrypted. These characteristics make it hard for individuals to access the hidden data.

The second method of reading the over provisioning space consists of reading the flash chips directly. This can be done by removing the flash chips and inserting them into a reading device that reads and stores their contents. To remove the flash chips involves desoldering the flash chips form the memory array. This may also be accomplished via electronic means of reading the flash chips while they remain installed on the SSD circuit.

There are several remaining steps currently required to recover hidden data from an SSD. After the flash memory chips are read and the data is saved as a PBA image, the LBA space is read over the host computer interface and the data is saved as a LBA image. Next, the flash memory errors in the PBA image are corrected, if possible. The error correction information is deleted from the image, leaving only data. The PBA and LBA images are then compared, noting which sectors match in each image. Finally, the unmatched PBA sectors are separated and stored as hidden data.

The described existing process contains several issues. First, the format of the data within a flash memory chip varies greatly depending on the make and model of the SSD, as well as the make and model of the memory chip. This format must be determined before any hidden data can be recovered, which takes time. Additionally, the error correction code (ECC) that is used to prevent flash memory bit errors is typically unknown and is not published by the SSD manufacturer. It therefore may not be possible to correct errors in the raw data that is read from the flash chips. Further complicating matters is that the amount of data may be huge, reaching as high as the terabyte range. This means that the algorithms that are used must be of low complexity and have a low run time for large data sets, which could take days, weeks, or longer to complete. The standard approach to this problem is to represent each sector with a short hash value. For example, the use of an eight-byte hash value for each sector would reduce the data storage requirements by 98.5% compared to handling the raw 512-byte sectors. Provisions would need to be made to handle hash collisions.

However, even with the above hash optimization, the LBA and PBA images still bear no relation to one another due to the wear leveling algorithm used in the SSD, which significantly fragments stored files. This means that an LBA image file that is stored in contiguous sectors will be distributed over a large area of the PBA image with no simple mapping relationship, that mapping relationship being different for every make and model of SSD, as well as changing as a given SSD is used. This means that the matching process could potentially be an order of $n^2$ process, which would be quite slow.

The above process works well when the errors in the PBA image have been corrected. If they have not been corrected, then any bit errors in the PBA sector source data will skew hash values and prevent them from matching to corresponding LBA sectors.

Given the foregoing, what is needed are methods which facilitate identifying and recovering data that is normally hidden in NAND flash memory arrays in SSDs and is normally inaccessible using host computer interfaces, without having to reverse engineer the algorithms in the SSD, using a hash value that is tolerant of some small percentage of bit errors in the source data.

SUMMARY

This Summary is provided to introduce a selection of concepts. These concepts are further described below in the Detailed Description section. This Summary is not intended to identify key features or essential features of this disclosure's subject matter, nor is this Summary intended as an aid in determining the scope of the disclosed subject matter.

A method of isolating hidden data in a solid state memory system is disclosed. The method comprises obtaining a logical block address (LBA) image from the memory system, obtaining a physical block address (PBA) image, and determining whether an error exists in the PBA image and correcting the error. The method also comprises calculating an error tolerant cyclic redundancy check (ETCRC) on each sector of the LBA image and building a search tree indexed on the ETCRC value. For each sector in the PBA image, the method also comprises computing the (ETCRC) value and searching for the ETCRC value in the LBA search tree. If the ETCRC value found, the method compares the cyclic redundancy check (CRC) of the LBA and PBA sectors. The method also provides for outputting to an output file the PBA sector as hidden data if either the ETCRC value is not found in the LBA search tree or the CRC comparison fails.

Another method of computing a total hash function of an array of values, which limits the impact of a change in the array of values to one subfield in the hash value is also disclosed. The method comprises dividing the array of values into a number of sections, computing a hash function over each section, and concatenating the computed hash function values to create a total hash function of the array of values, wherein a change in one of the array of values is reflected as a change in the total hash function in only one subfield.

A hidden data determination system for locating hidden date in a memory array of a solid state device is also disclosed. The system comprises an interface to access memory space on a memory device and a graphics processing unit to create a plurality of hash values for a logical block address (LBA) memory space of the memory device and to create a plurality of hash values for a physical block address (PBA) memory space of the memory to identify data hidden within the PBA memory space from view of the LBA memory space. The system also includes display device to show the data hidden.

BRIEF DESCRIPTION OF THE DRAWINGS

A more particular description briefly stated above will be rendered by reference to specific embodiments thereof that are illustrated in the appended drawings. Understanding that these drawings depict only typical embodiments and are not therefore to be considered to be limiting of its scope, the embodiments will be described and explained with additional specificity and detail through the use of the accompanying drawings in which:

FIG. 6 shows a representation of a PBA and an LBA ETCRC during a puncturing process;

FIG. 12 shows an embodiment of a table of puncturing patterns;

DETAILED DESCRIPTION

Figure 1:
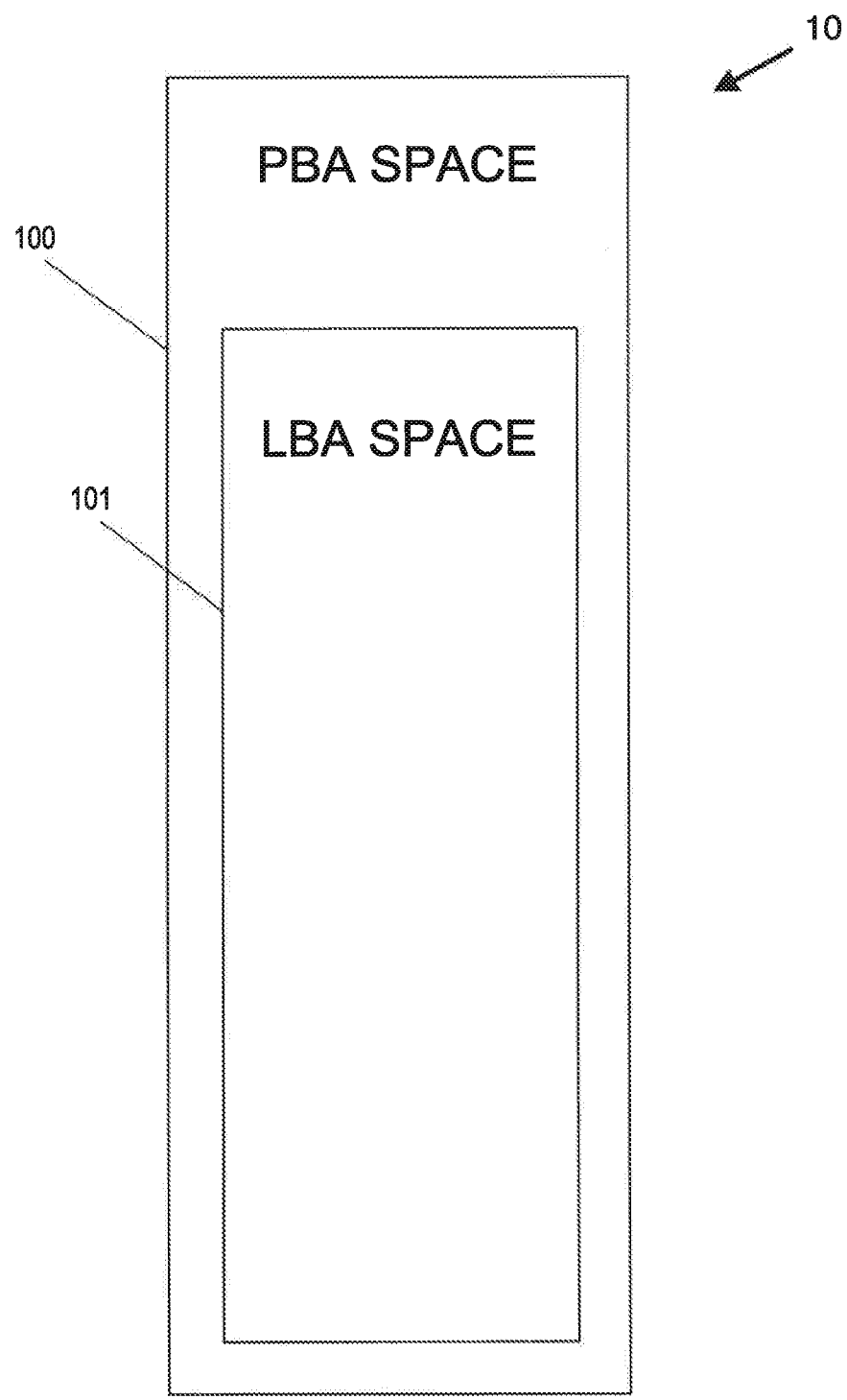
FIG. 1 is an image illustrating an exemplary relationship between the PBA space and the LBA space in the memory array of an SSD.

Embodiments are described herein with reference to the attached figures wherein like reference numerals are used throughout the figures to designate similar or equivalent elements. The figures are not drawn to scale and they are provided merely to illustrate aspects disclosed herein. Several disclosed aspects are described below with reference to non-limiting example applications for illustration. It should be understood that numerous specific details, relationships, and methods are set forth to provide a full understanding of the embodiments disclosed herein. One having ordinary skill in the relevant art, however, will readily recognize that the disclosed embodiments can be practiced without one or more of the specific details or with other methods. In other instances, well-known structures or operations are not shown in detail to avoid obscuring aspects disclosed herein. The embodiments are not limited by the illustrated ordering of acts or events, as some acts may occur in different orders and/or concurrently with other acts or events. Furthermore, not all illustrated acts or events are required to implement a methodology in accordance with the embodiments.

Notwithstanding that the numerical ranges and parameters setting forth the broad scope are approximations, the numerical values set forth in specific non-limiting examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 4.

Embodiments disclosed herein are directed to a method that facilitates forensic data recovery. The embodiments include a method which facilitates a process wherein the physical block address (PBA) and logical block address (LBA) memory spaces are examined to identify and collect hidden data without having to reverse engineer the algorithms in the Solid state drives (SSDs)(SSD used herein as an abbreviation for a single Solid state drive), by providing a hash value that is tolerant of a small percentage of bit errors in the source data.

The term "hidden data" and/or the plural form of this term are used throughout herein to refer to data stored on a SSD that is not accessible through the SSD's host computer interface, and the like.

Figure 2:
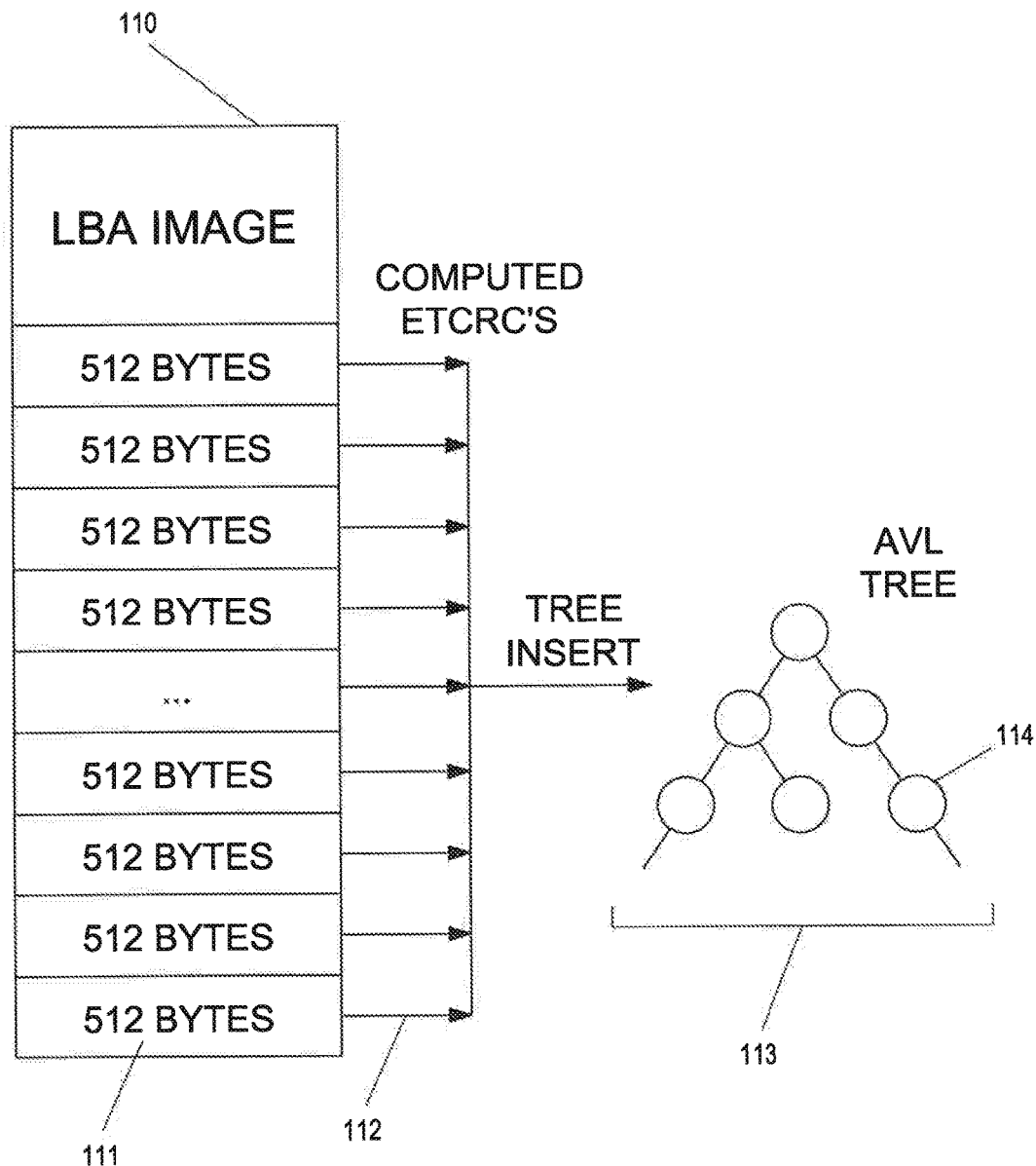
FIG. 2 shows a block diagram of LBA data used to construct an Adelson-Velsky and Landis' (AVL) tree.

FIG. 2 shows a block diagram of LBA data used to construct an Adelson-Velsky and Landis' (AVL) tree. The AVL tree 113 is a self-balancing binary search tree. In the AVL tree 113, the heights of the two child subtrees of any node 114 differ by at most one. If at anytime they differ by more than one node, rebalancing is done to restore this property. The LBA image 110 is composed of 512-byte sectors 111. The LBA image 110 and a PBA image 120, discussed further below, consist of a linear array of sectors. Each sector 111 is examined and a special hash value 112 is computed, called an Error Tolerant Cyclic Redundancy Check (ETCRC), described in detail further below. Based on the value of the ETCRC, a node 114 is either inserted (if a node of that value is not present) or updated in the AVL tree 113. This process creates a tree 113 which is quickly searchable by ETCRC value, and is much smaller than the LBA image 110.

It is possible that two sectors will have the same data, and therefore the same ETCRC values, and will indicate the same node of the tree. To track all the sectors with the same ETCRC, each tree node contains a linked list of associated LBA sector information, comprised of the byte offset of each sector within the LBA image 110, and a Cyclic Redundancy Check (CRC) of each sector, typically a standard 32-bit CRC such as the CRC32 (commonly used in Ethernet).

Figure 3:
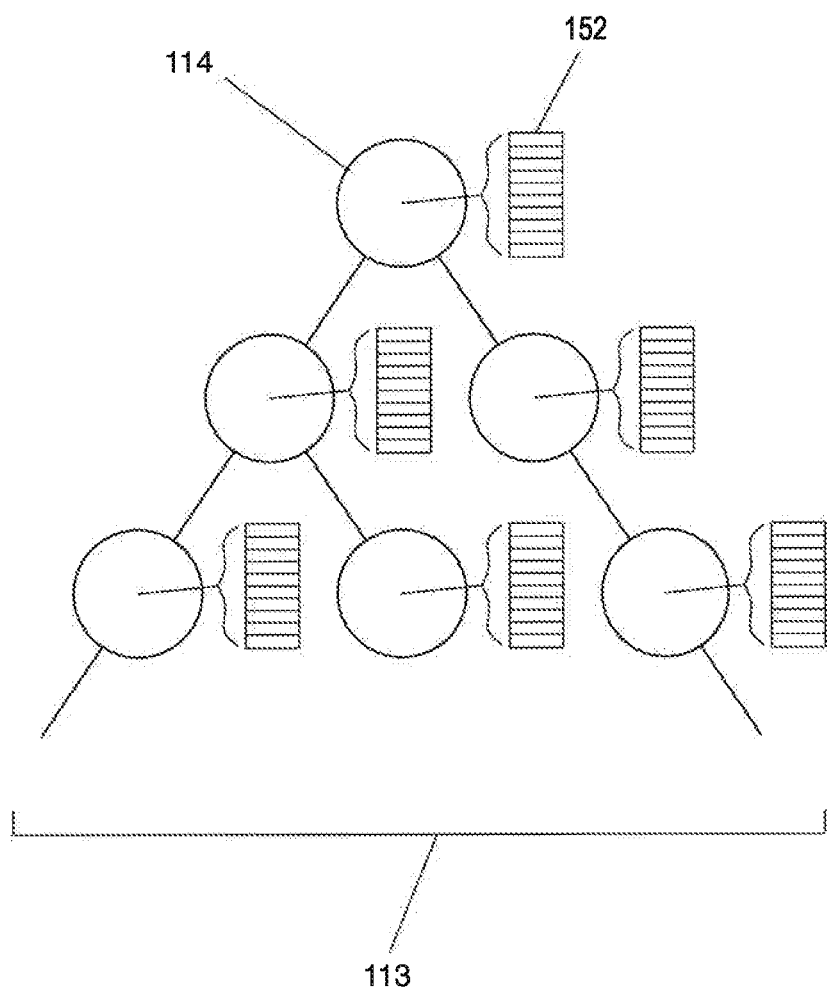
FIG. 3 shows an embodiment of a completed AVL tree, and each of several unique nodes is shown with a unique linked list.

FIG. 3 shows a completed AVL tree 113, and each of several unique nodes 114 is shown with a unique linked list 152. The completed AVL tree 113 is searchable by ETCRC value. Once the corresponding node is found, the associated linked list discloses the entire set of LBA sectors having that ETCRC value, and the 32-bit CRC of each.

Figure 4:
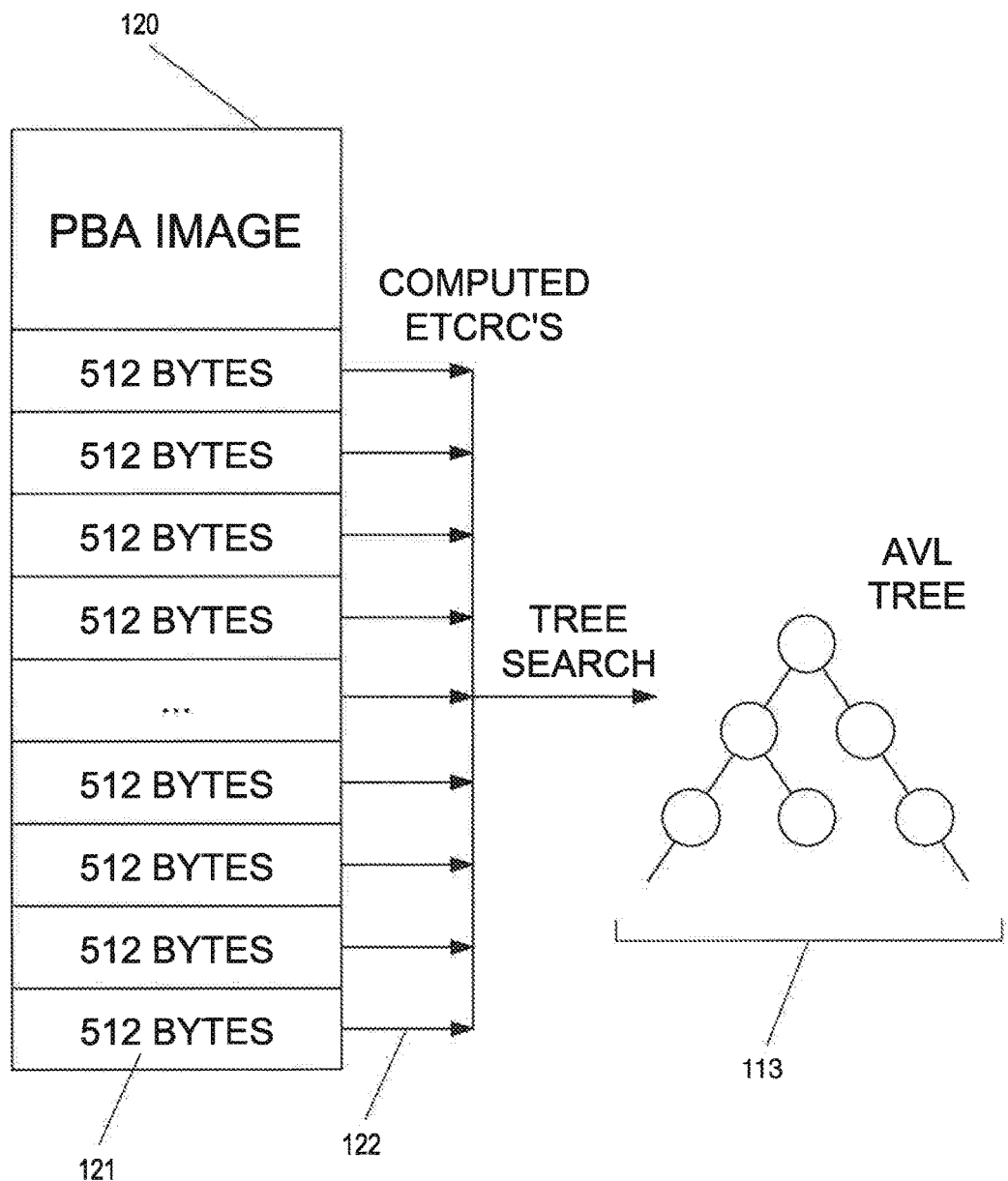
FIG. 4 shows a block diagram of PBA data used in conjunction with the LBA AVL tree.

FIG. 4 shows a block diagram of PBA data used in conjunction with the LBA AVL tree. To identify hidden data in the PBA image 120, the ETCRC 122 of each PBA sector 121 is searched for in the tree 113, and sectors not found are considered hidden. As illustrated in this embodiment, the PBA image 120 is composed of 512-byte sectors 121. The ETCRC values 122 are computed for each sector in the image 120. A search of the LBA AVL tree 113 is performed using the ETCRC value 122. If the search fails, the PBA sector does not appear in the LBA image 110, and the PBA sector is output to a file as hidden data. If the search succeeds, the linked list 152, as shown in FIG. 3, associated with the tree node is searched and the CRCs of the PBA sector and LBA sector are compared. If a match is not found, the PBA sector is output to a file as hidden data.

The inventors have found that this process works well, with the stated assumption that the errors present in the PBA image 120 have been corrected. If they have not been corrected, then any bit errors in the PBA sector source data will foul the hash and CRC values and prevent matches to corresponding LBA sectors.

More specifically, if bit errors in the PBA image 120 are not corrected, hash values computed on corresponding LBA sectors will not match. What is needed is a hash value that is tolerant of some small percentage of bit errors in the source data. This operation is antithetical to the standard definition of a hash function, where the hash value should change greatly with only one bit change in the source data.

Figure 5:
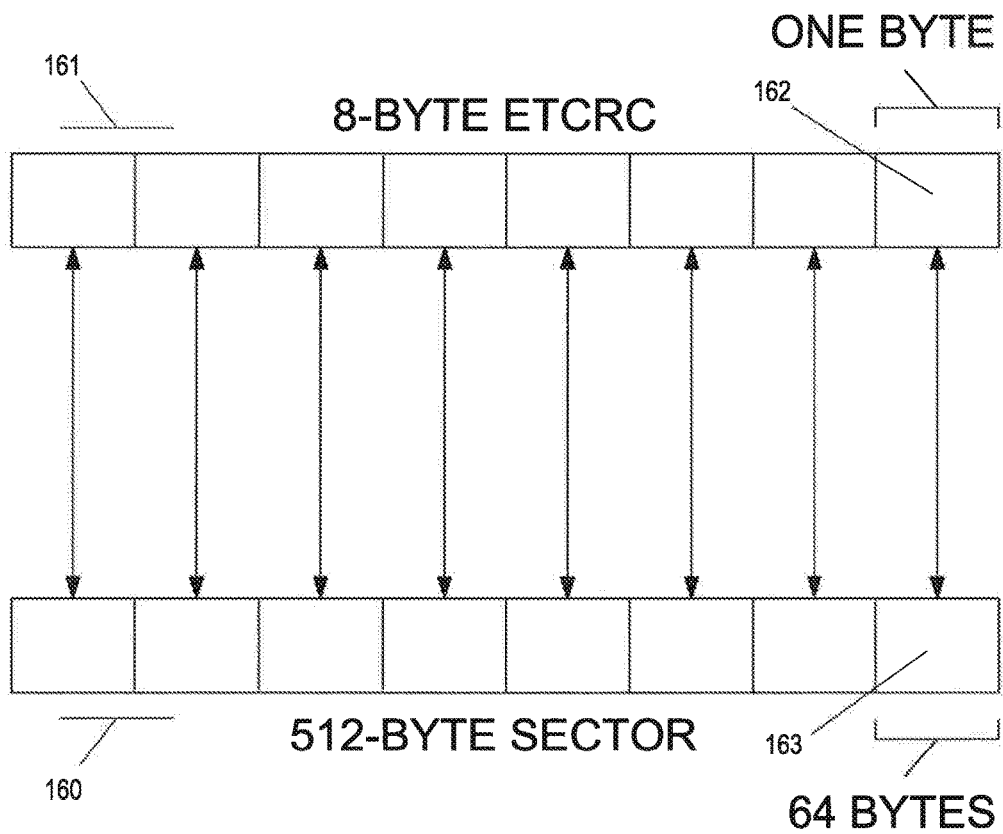
FIG. 5 shows a block diagram of ETCRC bytes relationship to byte (subfield) relationship to subsets of a sector.

FIG. 5 shows a block diagram of ETCRC byte (subfield) relationship to byte subsets in sectors. The ETCRC substantially serves the function of a hash, but is tolerant of some bit errors in the source data in that one bit change in the source data changes at most eight bits of the ETCRC. The ETCRC 161 is an 8-byte quantity that covers a 512-byte sector of data 160. Each byte 162 in the ETCRC is an 8-bit CRC (generator polynomial $x^8+x^7+x^4+x^2+x+1$) covering a 64-byte subset 163 of the 512-byte sector. Thus, if there are bit errors in only two 64-byte subsets, the entire ETCRC will not change, but only two component bytes. Two ETCRCs which match partially imply that the source data matches except for some bit differences in a certain area or areas. The final quality of the match can be determined by comparing the two corresponding source data sets byte for byte.

The ETCRC 161 can have a format and size suited to the task, not only eight bytes, but more or fewer, to accommodate various sizes of data to be hashed. Furthermore, the components of the ETCRC 161 can be other than 8-bits in length, as demanded by project requirements. Though the generator polynomial, $x^8+x^7+x^4+x^2+x+1$, was chosen, other generator polynomials may be used. The inventors found that the generator polynomial produces an acceptable collision rate of ~1E-3.

By using the ETCRC 161 as explained above, if there are uncorrected bit errors in a PBA sector, then the LBA and PBA ETCRC values 112, 122 will not match, but usually only in one or two bytes of the ETCRC value. This is handled by a process called puncturing, which involves selectively ignoring combinations of bytes within the ETCRC during the hidden data discovery process.

FIG. 6 shows a representation of a PBA and an LBA ETCRC during the puncturing process. As shown, the PBA and LBA ETCRC match except for one byte, the fourth from the left. The puncturing process sequentially sets corresponding bytes in the LBA and PBA ETCRC values to zero. When a byte pair 180 is set to zero, the ETCRCs still do not match. However, in the sequential process, when a byte pair 181 is set to zero, the ETCRC values match. This event indicates that the LBA and PBA sector data is mostly matching, and may only mismatch by one or a few bits, prompting a deeper look at these sectors to determine the magnitude of the mismatch.

The discovery process is run the first time with the full ETCRCs as computed. Once the first pass is complete, the hidden data output file contains all the PBA sectors that do not appear in the LBA, but also many falsely mismatched sectors that are different simply because of a few bit errors. The hidden data set is then run through the process again, but with each hidden sector ETCRC value punctured, as shown in FIG. 6, and with a modification of the LBA AVL tree 113 using punctured ETCRC values.

Puncturing may be performed using combinations of one, two, or more bytes of the ETCRC. To accommodate sectors with just a few bit errors in one 64-byte subset of the 512-byte sector, a single byte of the eight in an ETCRC is set to zero. There are eight such ETCRC puncturing patterns. To accommodate sectors with bit errors in two 64-byte subsets, two bytes of the eight in an ETCRC are set to zero. There are C(8, 2)=28 such ETCRC puncturing patterns. This level of puncturing is typically good enough to recover the vast majority of hidden data in the presence of PBA errors, though higher levels could certainly be used.

For convenience, the patterns used to puncture ETCRCs may be tabulated for use in the hidden data discovery process. As a non-limiting example, FIG. 12, shows such a table of puncturing patterns. There are 37 puncturing patterns (400 and 401) shown. In each pattern, there are eight digits. A zero in the pattern indicates a punctured byte in an eight-byte ETCRC value. A sample pattern 402 (01011111) indicates puncturing of the left most and third from left bytes in an ETCRC value.

The entire hidden data discovery process is shown in flowchart form in FIGS. 7-11. More specifically, FIGS. 7 through 11 collectively depict a flowchart of an embodiment of a method for identifying and recovering data that is normally hidden in NAND flash memory arrays in SSDs and is normally inaccessible using host computer interfaces, without having to reverse engineer the algorithms in the SSD, using a hash value that is tolerant of some small percentage of bit errors in the source data. In general, the inputs to this process are the LBA and PBA images, a DATA CORRECTED flag indicating whether the PBA image is error corrected, a tolerable error rate LIMIT if uncorrected, and a table containing ETCRC puncturing patterns. Regarding the table, a non-limiting example is shown and was discussed above with respect to FIG. 12 where the first entry indicates no puncturing, which is called an "empty pattern" in the flowchart 700.

Figure 7:
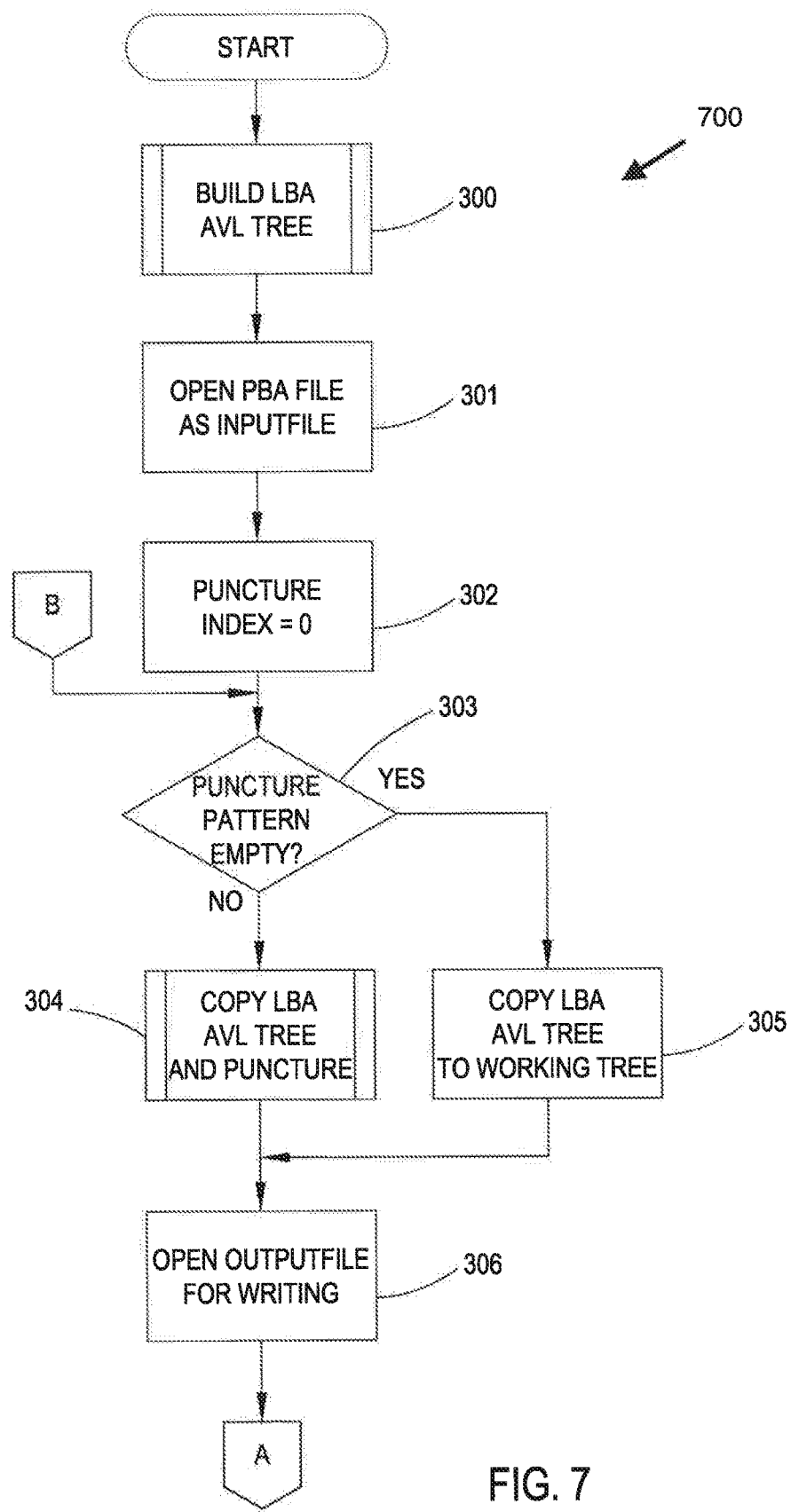
FIG. 7 shows a flowchart of an embodiment of a method.

FIG. 7 shows a flowchart of a method. FIG. 7 starts the method 700 with a subroutine call, at 300, to build the AVL tree. This subroutine is shown in more detail in FIG. 9 and is described further below. Generally, the LBA image 110 is scanned and an AVL tree 113 is built, suitable for searching using the ETCRC values computed from the data in the PBA image 120. Next, the PBA image is opened, at 301, as the file variable INPUTFILE. An operation, at 302, sets PUNCTURE_INDEX to zero, and this value indexes the table of puncture patterns in the process. The top of the main loop is marked with connector "B."

Within the main loop, the first main task 303-305 is to put the AVL tree 113 into a compatible format, depending on the puncturing pattern selected. If the pattern is "empty", meaning no puncturing is occurring (line 1 in the table of FIG. 12), then the LBA AVL tree 113 is copied, at 305, to a working tree and used as-is. If puncturing is occurring, then a subroutine "COPY LBA AVL TREE AND PUNCTURE", at 304, is called, which copies the LBA AVL tree 113 to the working tree while puncturing the ETCRC values and ensuring the tree meets the well-known AVL tree criteria. This step, at 304, is disclosed in further detail below with respect to FIG. 10. The hidden data output file is then opened, at 306, as the last operation in FIG. 7.

Figure 8:
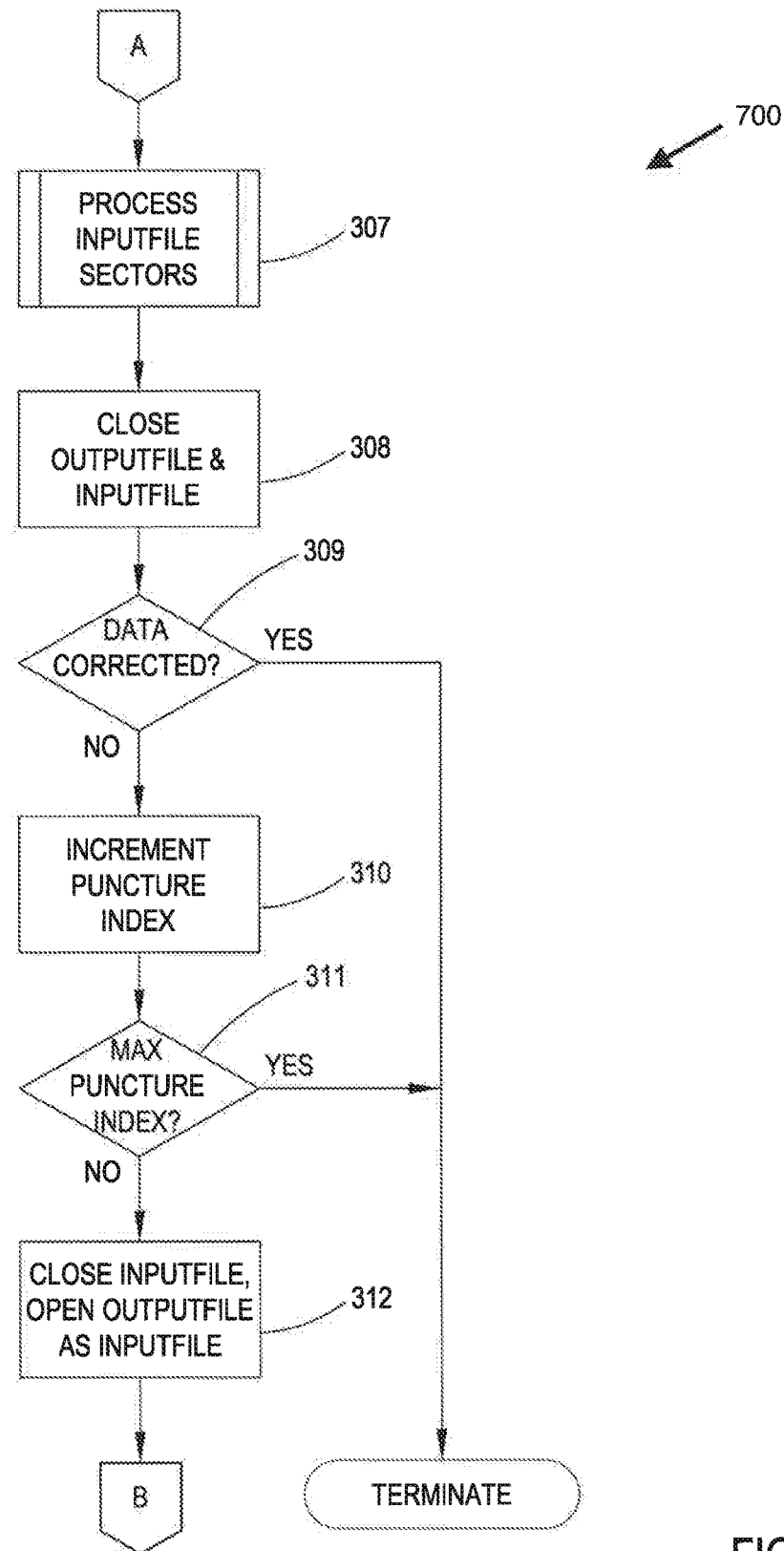
FIG. 8 shows a continuation of the flowchart of the embodiment of the method started in FIG. 7.

The flowchart 700 continues in FIG. 8 with a call to a subroutine, at 307, "PROCESS INPUTFILE SECTORS." This subroutine reads sectors from INPUTFILE and searches for them in the working AVL tree 113, outputting hidden sectors to OUTPUTFILE. This subroutine is described in detail further below with respect to FIG. 11.

An operation, at 308, closes the INPUTFILE and OUTPUTFILE files after all sectors are processed. If the PBA data is correct as supplied, a decision, at 309, terminates the process as no puncturing is required to complete hidden data discovery. If the PBA data is not correct as supplied, the PUNCTURE_INDEX is incremented, at 310, and tested, at 311, for maximum value, terminating the process if so. Else, the INPUTFILE is closed, and the OUTPUTFILE is reopened as the new INPUTFILE, at 312, feeding the latest hidden data back into the process for further examination with a different puncturing pattern. This completes the description of the main loop in FIGS. 7 and 8.

Figure 9:
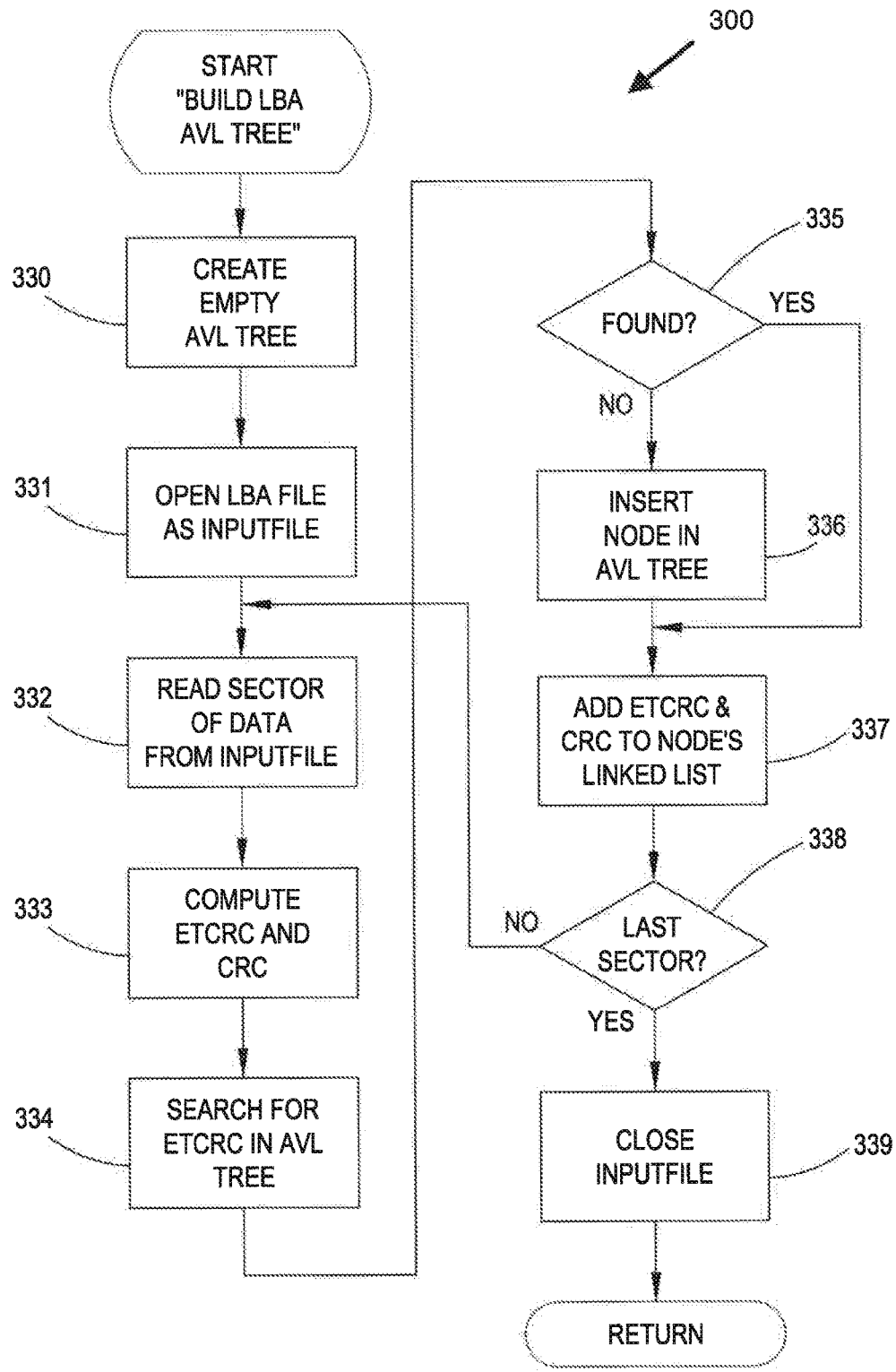
FIG. 9 shows an embodiment of the subroutine of BUILD LBA AVL TREE shown in FIG. 7.

FIG. 9 shows the subroutine that builds the LBA AVL tree, at represented in general at step 300. Generally, the LBA image 110 is scanned and the AVL tree 113 is built, suitable for searching using the ETCRC values computed from the data in the PBA image 120.

An empty working tree is created, at 330, first, and the LBA image 110 is opened, at 331, as INPUTFILE. The top of the loop in this subroutine reads, at 332, a sector of data from INPUTFILE. The ETCRC and CRC values are computed, at 333. The ETCRC is searched for, at 334 in the tree. If not found, a node corresponding to the ETCRC is inserted, at 326 into the tree 113.

The node in the tree corresponding to the ETCRC then has the INPUTFILE byte offset and CRC of the sector stored, at 337, into the linked list. A decision block, at 338, at the end of the loop terminates the loop after the last LBA sector has been examined. The INPUTFILE is then closed, at 339.

Figure 10:
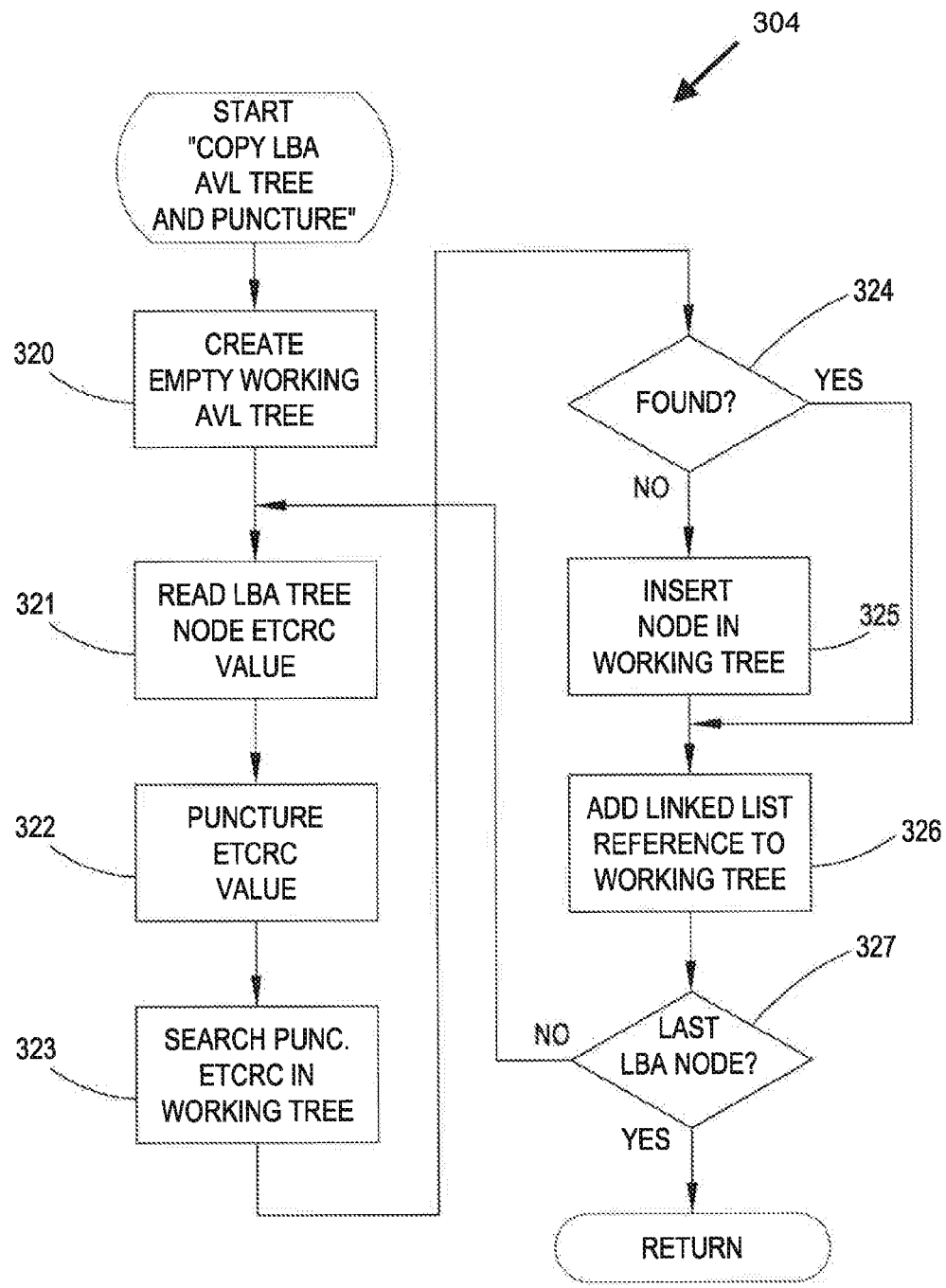
FIG. 10 shows an embodiment of the subroutine COPY LBA AVL TREE AND PUNCTURE shown in FIG. 7.

The LBA AVL tree is now ready for use. FIG. 10 shows a subroutine "COPY LBA AVL TREE AND PUNCTURE", as originally identified at step 304. This subroutine copies the LBA AVL tree 113 to the working tree while puncturing the ETCRC values and ensuring the tree meets the well-known AVL tree criteria. An empty working tree, at 320, is created first. The top of the loop in this subroutine reads an LBA tree node ETCRC value, at 321, then punctures, at 322, that value according to the current PUNCTURE INDEX table indexed puncture pattern. That punctured ETCRC is searched for, at 323, in the working tree. If not found, the ETCRC is inserted, at 325, into the tree.

The node in the working tree corresponding to the punctured ETCRC then is updated, at 326, with a reference to the linked list from the original LBA AVL tree 113. The puncturing process can have the effect of combining two or more LBA AVL tree nodes 114. Rather than copying all the linked lists associated with those nodes into the working tree, references to the original LBA tree tables are stored, saving memory. A decision block, at 327, at the end of the loop terminates the loop after the last LBA node has been loaded into the working tree.

Figure 13:
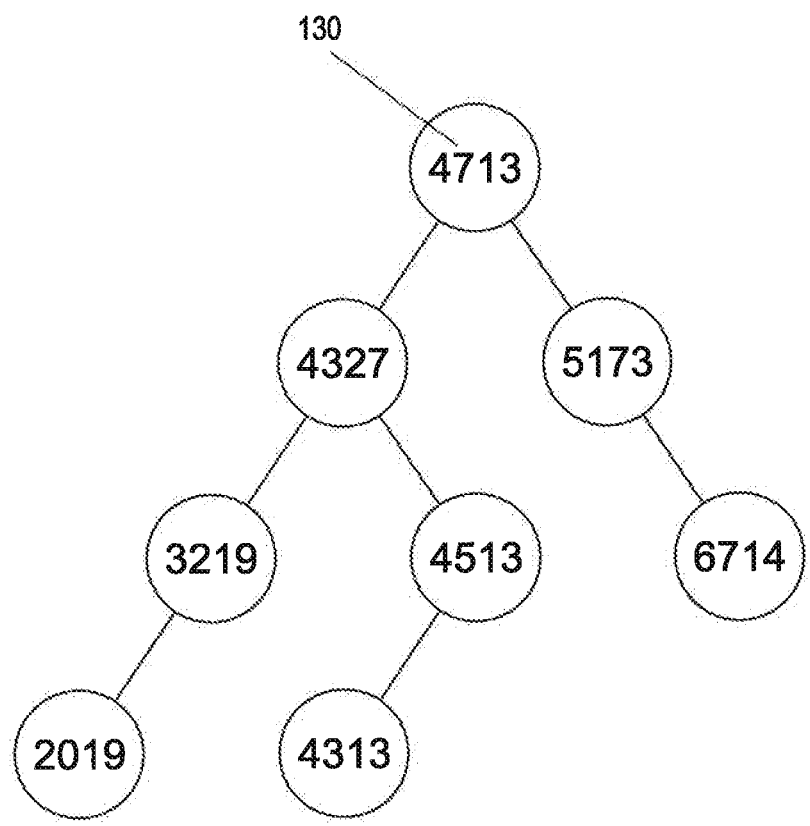
FIG. 13 shows an embodiment of a block diagram of an AVL tree labeled with sample ETCRC values.

FIG. 13 shows a block diagram of an AVL tree labeled with sample ETCRC values. The embodiment in FIG. 13 is a non-limiting example. As shown, four digits are provided in each node for the sake of discussion and brevity. A node 130 is shown containing the decimal value 4713.

Figure 14:
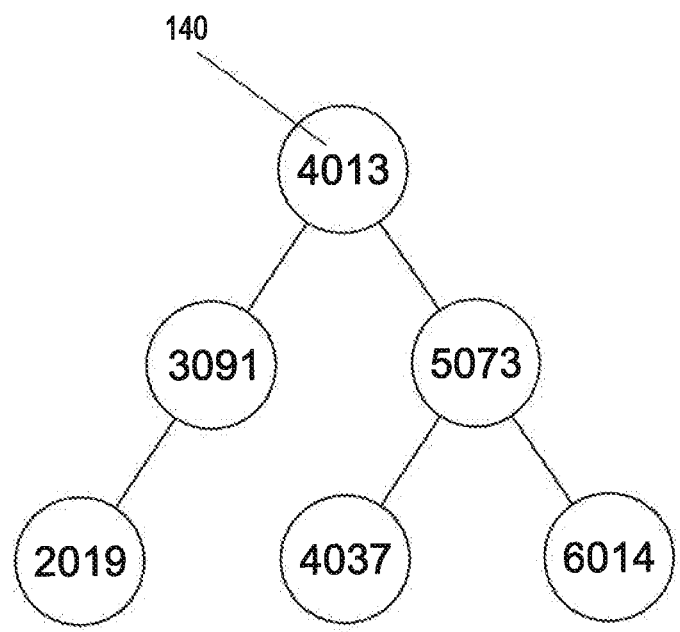
FIG. 14 shows an embodiment of a block diagram of information in the AVL tree after puncturing and rebalancing of the AVL tree.

FIG. 14 shows the information after puncturing and rebalancing of the AVL tree. The third digit from the right in each number has been punctured by replacing it with a zero. For the FIG. 14 values 4713, 4513, and 4313, the puncturing process makes them all identical, at a value of 4013. The node 140 takes on this value. This node also carries with it references to the linked lists from the three original nodes in FIG. 13 (reference not shown). The net effect is that the punctured and rebalanced tree in FIG. 14 produces more search hits on similarly punctured ETCRC values, increasing the likelihood of finding a match among LBA and PBA sectors that differ in only a few bits.

Figure 11:
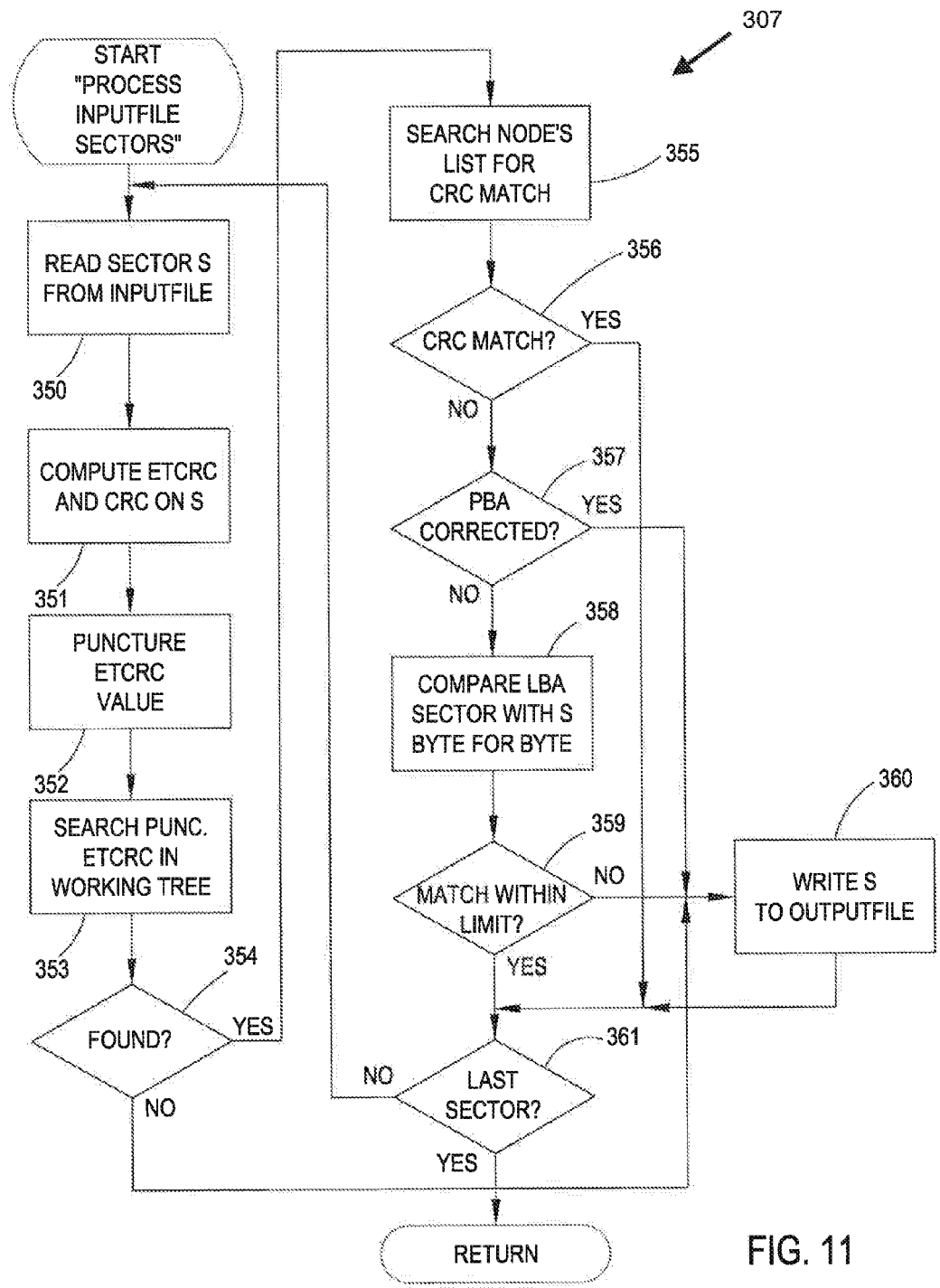
FIG. 11 shows an embodiment of the subroutine PROCESS INPUTFILE SECTORS shown in FIG. 8.

FIG. 11 shows a subroutine "PROCESS INPUTFILE SECTORS". This subroutine was provided for at 307 in FIG. 8. This subroutine reads sectors from INPUTFILE and searches for them in the working AVL tree, outputting hidden sectors to OUTPUTFILE. At the top of the loop in this subroutine, a sector S is read, at 350, from the INPUTFILE, and INPUTFILE is either the PBA image 120 or a subsequent hidden data file. The ETCRC and CRC are computed, at 351, on the sector S. The ETCRC value is punctured, at 352, according to the current tabulated puncture pattern and specified by PUCNTURE_INDEX. That punctured ETCRC is searched for, at 353, in the working tree. If not found, the sector S is written, at 360, to the hidden data output file. If found, the node's linked list (or multiple lists in the case of a punctured-ETCRC based working tree) is searched, at 355, for the CRC of sector S. If found, at 356, the sector is not a hidden data sector and execution falls to the bottom of the loop, at 361. If the CRC indicates a mismatch, the disposition of sector S depends on the corrected status, at 357, of the PBA image 120. If the PBA is corrected, then a CRC mismatch indicates a data mismatch and sector S is written, at 360, to the hidden data output file. If the PBA is uncorrected, then the LBA sector data is compared, at 358, with sector S byte for byte. The fraction of mismatch (bits not matching divided by total bits in the sector) is compared, at 359, against the specified mismatch LIMIT. A mismatch causes sector S to be written, at 360, to the hidden data output file. The bottom of this subroutine's loop checks, at 361, to see if all sectors in INPUTFILE have been processed, looping if not, returning to the caller if so.

After isolation of the hidden data, commercial tools can be applied to identify interesting information, such as word processing documents, spreadsheets, videos, and images.

Figure 15:
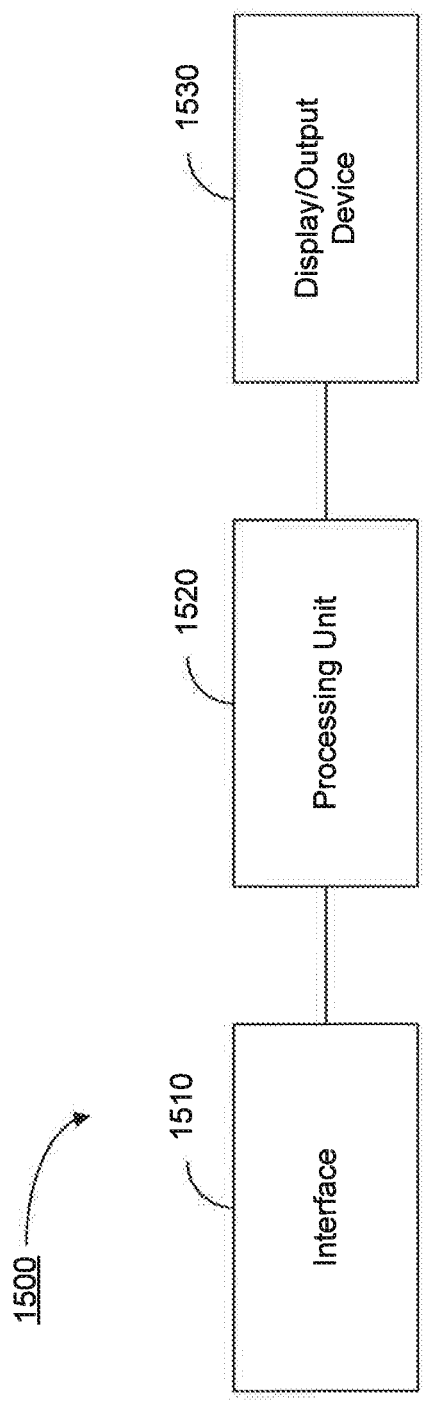
FIG. 15 shows a block diagram of an embodiment of a device as disclosed herein.

FIG. 15 shows a block diagram of an embodiment of a device. The device 1500 comprises an interface 1510 to access memory space on a memory device, such as, but not limited to, a memory array on the SSD. A graphics processing unit 1520, or simply a processing unit, is also provided to create a plurality of hash values for a logical block address (LBA) memory space of the memory device and to create a plurality of hash values for a physical block address (PBA) memory space of the memory to identify data hidden within the PBA memory space from view of the LBA memory space. A display 1530, or output device, is also provided to show the located hidden data. The display may be a visual display or may produce a printout with information pertaining to the hidden data. Thus, the term display is not used herein to be considered limiting.

Thus, as also disclosed above creating the hash value for both the LBA and PBA memory spaces comprises creating an error tolerant cyclic redundancy check (ETCRC) table for both the LBA memory space and PBA memory space.

The disclosed embodiments are conformable to parallel processing on a graphics processing unit (GPU). The ETCRC process is performed on each LBA and PBA sector independently and therefore may be paralleled. Furthermore, the matching process for each LBA sector may be paralleled. The embodiments may be designed to allow for extensive parallelism and commensurate acceleration.

As another non-limiting example, the embodiments disclosed herein may be used with the on-board chip reader adapter disclosed in U.S. patent application Ser. No. 14/716,866, which claims priority to U.S. Provisional Application 62/000,475 filed May 19, 2014, both which are incorporated herein by reference in its entirety Even though the disclosed embodiments do not match the PBA and LBA sectors the same way that the SSD FTL software would, it does not matter because the output that is valuable is the unique, hidden PBA data, without regard for the PBA/LBA mapping relationship maintained by the FTL. Specifically, as a non-limiting example, for four PBA sectors containing data values A, B, B, and C, with the LBA showing sectors with values A, B, and C, an embodiment disclosed herein outputs as hidden data one sector with data value B. It does not matter what the PBA/LBA mapping was for that sector. It only matters that a sector with that value was recovered from the hidden PBA space. This is advantageous in that a determination of the PBA/LBA mapping relationship is not required, which is different for most types of SSD and FTL algorithms.

Several general advantages of this invention include, but are not limited to the following: hidden data is discovered, data not accessible over the usual computer interface for the storage device; only the most basic knowledge of the storage format is required, and no information about the FTL mapping between LBA to PBA; knowledge of the error correction methods is optional, and the error tolerant cyclic redundancy check makes hidden data discovery possible in a reasonable time frame; identification of the hidden data is accomplished in a reasonable amount of time, using a reasonable amount of storage that is approximately about 10% of the size of the LBA image.

While various aspects of the present disclosure have been described above, it should be understood that they have been presented by way of example and not limitation. It will be apparent to persons skilled in the relevant art(s) that various changes in form and detail can be made therein without departing from the spirit and scope of the present disclosure. Thus, the present disclosure should not be limited by any of the above described exemplary aspects.

In addition, it should be understood that the figures in the attachments, which highlight the structure, methodology, functionality and advantages of the present disclosure, are presented for example purposes only. The present disclosure is sufficiently flexible and configurable, such that it may be implemented in ways other than that shown in the accompanying figures (e.g., implementation within computing devices and environments other than those mentioned herein). As will be appreciated by those skilled in the relevant art(s) after reading the description herein, certain features from different aspects of the method of the present disclosure may be combined to form yet new aspects of the present disclosure.

Further, the purpose of the foregoing Abstract is to enable the U.S. Patent and Trademark Office and the public generally and especially the scientists, engineers and practitioners in the relevant art(s) who are not familiar with patent or legal terms or phraseology, to determine quickly from a cursory inspection the nature and essence of this technical disclosure. The Abstract is not intended to be limiting as to the scope of the present disclosure in any way.

What is claimed is:

1. A method of isolating hidden data in a solid state memory system, the method comprising:
    obtaining a logical block address (LBA) image from the memory system;
    obtaining a physical block address (PBA) image;
    determining whether an error exists in the PBA image and correcting the error;
    calculating an error tolerant cyclic redundancy check (ETCRC) on each sector of the LBA image and building a search tree indexed on the ETCRC value;
    for each sector in the PBA image, computing the ETCRC value and searching for the ETCRC value in the LBA search tree;
    if the ETCRC value found, comparing a cyclic redundancy check (CRC) of the LBA and PBA sectors; and
    outputting to an output file the PBA sector as hidden data if either the ETCRC value is not found in the LBA search tree or the CRC comparison fails.

2. The method according to claim 1, further comprising:
    selecting one of several puncturing patterns for ETCRC values;
    building a punctured ETCRC working search tree from the LBA search tree;
    for each sector in the hidden data file, computing the punctured ETCRC value and searching for the punctured ETCRC value in the working search tree;
    if the ETCRC value is found, comparing the data of the LBA and hidden data sectors; and
    outputting to a new hidden data output file the previous hidden data file sector if either the ETCRC value is not found in the LBA search tree or the data comparison fails as specified by a predefined limit.

3. The method according to claim 1, wherein the search tree indexed on the ETCRC value is an Adelson-Velsky and Landis' (AVL) tree.

4. The method according to claim 1, further comprising:
    after the step of obtaining a physical block address (PBA) image, determining whether an error exists in the PBA image and correcting the error.

5. The method according to claim 4, wherein for each sector in the PBA image, the processing unit computes an ETCRC value and searches for the ETCRC value in the LBA search tree.

6. The system method according to claim 5, wherein the processing unit outputs to an output file the PBA sector as hidden data if either the ETCRC value is not found in the LBA search tree or the CRC comparison fails.

7. A method of computing a total hash function of an array of values which limits the impact of a change in the array of values to a subfield in the hash value, the method comprising:
    dividing the array of values into a number of sections;
    computing a hash function over each section; and
    concatenating the computed hash function values to create a total hash function of the array of values, wherein a change in one of the array of values is reflected as a change in the total hash function in only one subfield;
    wherein the hash function is tolerant of bit errors in the source data.

8. A hidden data determination system for locating hidden data in a memory array of a solid state device, the system comprising:
    an interface to access memory space on a memory device;
    a processing unit to create a plurality of hash values for a logical block address (LBA) memory space of the memory device and to create a plurality of hash values for a physical block address (PBA) memory space of the memory to identify data hidden within the PBA memory space from view of the LBA memory space;
    wherein the graphics processing unit:
        creates a PBA index table associated with the plurality of PBA hash values;
        compares the plurality of LBA hash values with the PBA index table;
        identifies matches of any of the plurality of LBA hash values and any of the plurality of PBA hash values resulting from the step of comparing; and
        identifies data hidden within the PBA memory space when data identified in the PBA index table has no identified with any of the plurality of LBA hash values; and a display device to show the data hidden.

9. The system according to claim 8, wherein the processing unit creates the hash value for both the LBA and PBA memory spaces as an error tolerant cyclic redundancy check (ETCRC) table for both the LBA memory space and PBA memory space.

10. The system according to claim 9, further comprising creating at least one of the LBA ETCRC table and the PBA ETCRC table with a search tree.

11. The system according to claim 8, wherein the processing unit selectively ignores combinations of fields with the PBA ETCRC table and LBA ETCRC table to resolve any uncorrected bit errors in the PBA memory space.

12. The system according to claim 8, wherein the processing unit identifies matches by removing the matches after initially identifying matches occurs and then creates a second LBA ETCRC table, and then repeats to identify matches to increase a rate of execution.

13. The system according to claim 8, wherein the processing unit selectively ignores combinations of fields with the PBA ETCRC table and the second LBA ETCRC table to resolve any uncorrected bit errors in the PBA memory space.

14. The system according to claim 8, wherein the processing unit creates the LBA ETCRC table from each memory sector of the LBA memory space, and the processing unit creates the PBA memory space table from each memory sector of the PBA memory space.

15. The system according to claim 8, wherein hidden data located is located without regard to a flash translation layer (FTL) mapping relationship between the PBA memory space and LBA memory space.

16. The system according to claim 8, wherein the search tree comprises an Adelson-Velsky and Landis' (AVL) tree.

17. The system according to claim 8, wherein the processing unit calculates an ETCRC on each sector of the LBA image and builds a search tree indexed on the ETCRC value.

18. The system according to claim 17, wherein if the ETCRC value is found, the unit compares the cyclic redundancy check (CRC) of the LBA and PBA sectors.

* * * * *

UNITED STATES PATENT AND TRADEMARK OFFICE
CERTIFICATE OF CORRECTION

PATENT NO. : 9,778,975 B2
APPLICATION NO. : 14/716872
DATED : October 3, 2017
INVENTOR(S) : Henry B. Wallace and David Sun Page 1 of 1

It is certified that error appears in the above-identified patent and that said Letters Patent is hereby corrected as shown below:

On the Title Page

Left column, Item (72), second named Inventor, delete "Fincastle" and insert --Great Falls--.

Signed and Sealed this
Eighteenth Day of September, 2018

Andrei Iancu
*Director of the United States Patent and Trademark Office*